(12) United States Patent
Nebu

(10) Patent No.: US 9,267,971 B2
(45) Date of Patent: Feb. 23, 2016

(54) ENERGY CONSUMPTION MONITORING SYSTEM, METHOD, AND COMPUTER PROGRAM

(76) Inventor: Kazuaki Nebu, Hokkaido (JP)

( * ) Notice: Subject to any disclaimer, the term of this patent is extended or adjusted under 35 U.S.C. 154(b) by 366 days.

(21) Appl. No.: 13/984,344

(22) PCT Filed: Jan. 18, 2012

(86) PCT No.: PCT/JP2012/050915
§ 371 (c)(1),
(2), (4) Date: Aug. 8, 2013

(87) PCT Pub. No.: WO2012/111373
PCT Pub. Date: Aug. 23, 2012

(65) Prior Publication Data
US 2013/0314073 A1  Nov. 28, 2013

(30) Foreign Application Priority Data

Feb. 14, 2011  (JP) ................................. 2011-029222

(51) Int. Cl.
*G06F 1/00* (2006.01)
*G01R 21/00* (2006.01)
(Continued)

(52) U.S. Cl.
CPC .............. *G01R 21/00* (2013.01); *G01R 21/133* (2013.01); *G06Q 50/06* (2013.01); *H02J 3/14* (2013.01); *H02J 2003/143* (2013.01); *Y02B 70/3225* (2013.01); *Y04S 20/222* (2013.01)

(58) Field of Classification Search
None
See application file for complete search history.

(56) References Cited

U.S. PATENT DOCUMENTS

| 2007/0203860 | A1* | 8/2007 | Golden | G06Q 10/04 705/412 |
| 2010/0250440 | A1* | 9/2010 | Wang | G06Q 10/06 705/63 |
| 2010/0257158 | A1* | 10/2010 | Sugaya | H04L 12/2809 707/723 |

FOREIGN PATENT DOCUMENTS

| JP | 2001-344027 A | 12/2001 |
| JP | 2009-257952 A | 11/2009 |

(Continued)

OTHER PUBLICATIONS

PCT International Patent Application No. PCT/JP2012/050915, International Preliminary Report on Patentability mailed Aug. 29, 2013, 5 pages.

(Continued)

*Primary Examiner* — Kim Huynh
*Assistant Examiner* — Paul J Yen
(74) *Attorney, Agent, or Firm* — Morgan, Lewis & Bockius LLP

(57) ABSTRACT

The monitoring device includes: a load specifying information storage unit which stores, for each type of the load, information including typical energy consumption and a usage time slot of the load; and a recommended consumption information storage unit which stores recommended consumption of energy for each type of the load. Once consumption information is received from the measurement instrument, a load specification unit refers to the load specifying information storage unit and specifies a type of the load used. Then, a determination processing unit refers to the recommended consumption information storage unit and determines whether or not the energy consumption of the load falls within a range of the recommended consumption. An instruction to transmit a report signal is given to the measurement instrument when it is determined as a result of the determination that the energy consumption of the load exceeds the range of the recommended consumption.

6 Claims, 10 Drawing Sheets

(51) Int. Cl.
*G06Q 50/06* (2012.01)
*G01R 21/133* (2006.01)
*H02J 3/14* (2006.01)

(56) References Cited

FOREIGN PATENT DOCUMENTS

| JP | 2010-128617 A | 6/2010 |
|---|---|---|
| JP | 2010-176373 A | 8/2010 |
| JP | 2010-181159 A | 8/2010 |
| JP | 2010-205114 A | 9/2010 |
| JP | 4648482 B1 | 12/2010 |
| JP | 2011-18110 A | 1/2011 |

OTHER PUBLICATIONS

International Search Report for PCT Patent App. No. PCT/JP2012/050915 (Apr. 3, 2012).

* cited by examiner

FIG. 4

| SECTION | LOAD | LOAD SPECIFICATION INFORMATION ||
| --- | --- | --- | --- |
| | | POWER CONSUMPTION | USAGE TIME SLOT |
| SECTION 1 | LOAD 1 | 350W~800W | JUNE TO OCTOBER、 DECEMBER TO APRIL AM5:00~PM9:00 |
| | LOAD 2 | ・・・ | ・・・ |
| | LOAD 3 | ・・・ | ・・・ |
| SECTION 2 | ・・・ | ・・・ | ・・・ |
| ・ | ・ | ・ | ・ |
| ・ | ・ | ・ | ・ |
| ・ | ・ | ・ | ・ |

FIG. 5

| CUSTOMER | BRANCH CIRCUIT | SECTION |
|---|---|---|
| CUSTOMER 1 | BRANCH CIRCUIT 1 | SECTION 2 |
| | BRANCH CIRCUIT 2 | SECTION 5 |
| | . | . |
| | . | . |
| | . | . |
| . | . | . |
| . | . | . |
| . | . | . |

FIG. 6

| CUSTOMER | LOAD | POWER CONSUMPTION (W) | | | | |
|---|---|---|---|---|---|---|
| | | ... | 2011/01/28 07:10:01 | 2011/01/28 07:10:02 | 2011/01/28 07:10:03 | ... |
| CUSTOMER 1 | LOAD 1 | ... | 15.21 | 15.22 | 165.87 | ... |
| | LOAD 2 | ... | ... | ... | ... | ... |
| | LOAD 3 | ... | ... | ... | ... | ... |
| | ... | ... | ... | ... | ... | ... |
| CUSTOMER 2 | ... | ... | ... | ... | ... | ... |
| ... | ... | ... | ... | ... | ... | ... |

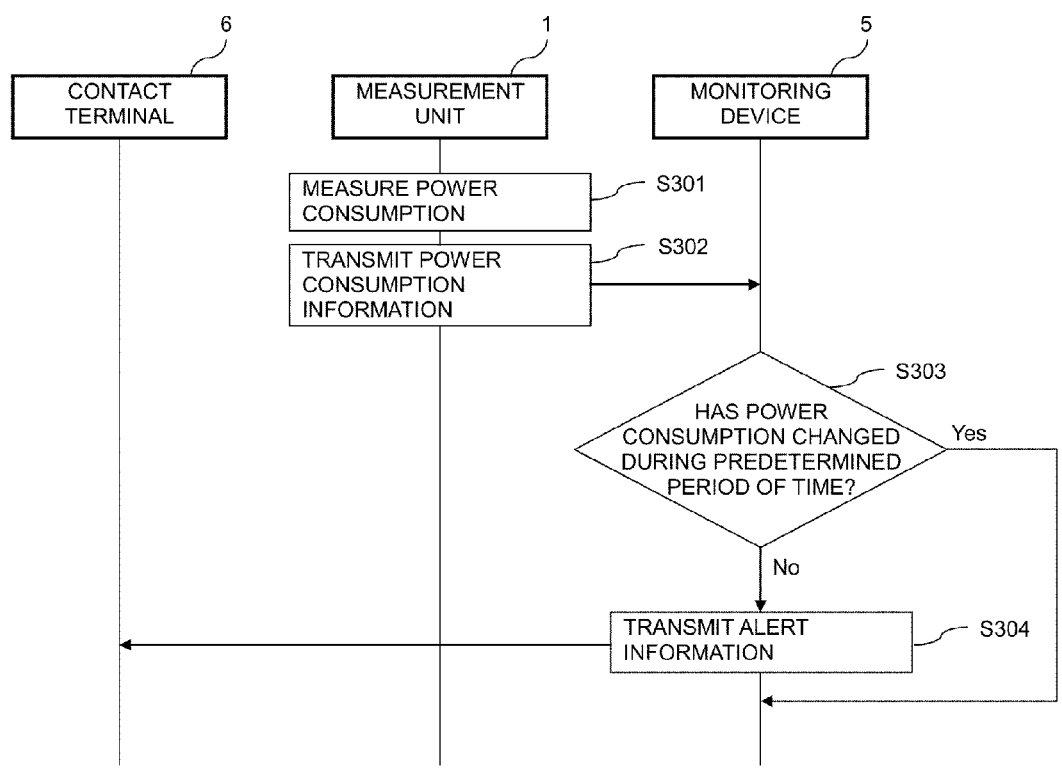

ENERGY CONSUMPTION MONITORING SYSTEM, METHOD, AND COMPUTER PROGRAM

This application is a national phase entry under 35 U.S.C. §371 of PCT Patent Application No. PCT/JP2012/050915, filed on Jan. 18, 2012, which claims priority under 35 U.S.C. §119 to Japanese Patent Application No. 2011-029222, filed Feb. 14, 2011, both of which are incorporated by reference.

TECHNICAL FIELD

The present invention relates to a technique which monitors energy consumption of each load.

BACKGROUND ART

In recent years, power consumption and a resource use state are collected through a network in managing the consumption of electrical power or the like or managing an operating state.

The information collected in the aforementioned manner can be applied to a variety of uses.

For example, the information can be applied to determine whether various apparatuses are in normal operation from a usage state of energy such as electrical power, determine living conditions of a customer who uses energy to promote energy saving, or quickly sense an abnormal event in one's life such as a solitary death.

In this respect, in Patent Literature 1, an operating state monitoring device is installed in each power consuming apparatus as a system which collects information used for the efficient management/operation of a power consuming apparatus group including a plurality of the power consuming apparatuses. Patent Literature 1 proposes such system including: fixed-cycle data collecting means which collects, from each power consuming apparatus through a network in a predetermined cycle, a power consumption value and an apparatus' operating state value indicating the operation result of an apparatus using electrical power; and data display controlling means which creates a display graph including an axis representing power consumption and an axis representing an apparatus' operating state, plots a dot indicating the power consumption and the apparatus' operating state of each power consuming apparatus at a position corresponding to the power consumption value and the apparatus' operating state value on the display graph, and displays the operating state of each power consuming apparatus.

CITATION LIST

Patent Literature

Patent Literature 1: Japanese Laid-Open Patent Application Publication No. 2010-205114

SUMMARY OF INVENTION

Technical Problem

According to the system described in Patent Literature 1 above, the information relevant to the apparatus' operating state such as the power consumption can be collected for each power consuming apparatus.

However, in the system described in Patent Literature 1 where the operating state monitoring device is installed in each power consuming apparatus, it is required that a plurality of the operating state monitoring devices be prepared for each power consuming apparatus and that the operating state monitoring device be installed in each power consuming apparatus.

This results in an increased cost of system operation as well as an increased workload for installing each of the operating state monitoring devices.

Now, an object of the present invention is to monitor energy consumption of each load without installing a device in each load consuming energy.

Means for Solving the Problem

In order to attain the above-mentioned object, the energy consumption monitoring system which monitors energy consumption by a load according to one aspect of the present invention comprises: a measurement instrument which measures an amount of energy supply for each supply line supplying energy to a plurality of loads as energy consumption of the supply line; and a monitoring device which collects information pertaining to the energy consumption measured, the measurement instrument and the monitoring device being configured to be able to communicate via a network, wherein the measurement instrument includes: measurement means which chronologically measures energy consumption of the each supply line; first consumption information transmission means which transmits consumption information pertaining to the measured energy consumption to the monitoring device; report instruction reception means which receives, from the monitoring device, an instruction to transmit a report signal in a case where the energy consumption by the load exceeds preset recommended consumption, the report signal reporting the case; and report signal transmission means which transmits the report signal on the basis of the instruction received, and the monitoring device includes: load specifying information storage means which stores each type of the load in association with load specification information including typical energy consumption of the load and a typical usage time slot of the load; recommended consumption information storage means which stores recommended consumption information pertaining to recommended consumption of energy for the each type of the load; consumption information reception means which receives the consumption information from the measurement instrument; load specification means which refers to the load specifying information storage means and specifies a type of the load used on the basis of the consumption information; determination processing means which refers to the recommended consumption information storage means and determines whether or not the energy consumption by the load specified falls within a range of the recommended consumption pertaining to the recommended consumption information; and report instruction transmission means which transmits an instruction to transmit the report signal to the measurement instrument when it is determined as a result of the determination process that the energy consumption pertaining to the consumption information exceeds the range of the recommended consumption pertaining to the recommended consumption information.

Furthermore, the energy consumption monitoring system may be that the monitoring device further comprises: advertisement information storage means which stores advertisement information of a load that operates with the recommended consumption of energy for the each type of the load; and advertisement information extraction means which refers to the advertisement information storage means and extracts advertisement information stored in association with the type of the load specified, when it is determined as a result of the determination process that the energy consumption by the load specified exceeds the range of the recommended consumption.

Furthermore, the energy consumption monitoring system may be that the first consumption information transmission means of the measurement instrument transmits to the monitoring device the consumption information pertaining to the measured energy consumption along with supply line identification information identifying the supply line, the monitoring device further comprises: corresponding information storage means which stores the supply line identification information in association with section identification information identifying a section in which the load is installed; and section specification means which refers to the corresponding information storage means and specifies the section identification information stored in association with the supply line identification information received from the measurement instrument, the consumption information reception means receives the consumption information along with the supply line identification information from the measurement instrument, the load specifying information storage means stores, for the each section identification information, a type of the load installed in the section pertaining to the section identification information in association with load specification information including typical energy consumption of the load and a typical usage time slot of the load, and the load specification means refers to the load specifying information storage means and specifies the type of the load used on the basis of the section identification information specified and the consumption information.

Furthermore, the energy consumption monitoring system may be that the system is configured to be able to further communicate with a customer terminal used by a customer who uses the load via the network, and the monitoring device further comprises second consumption information transmission means which transmits, to the customer terminal, information pertaining to the energy consumption of the each load specified on the basis of the consumption information received by the consumption information reception means and the information pertaining to the type of the load specified by the load specification means.

Furthermore, a method of monitoring energy consumption by a computer according to another aspect of the present invention which is configured to be able to communicate with a measurement instrument via a network, wherein the measurement instrument includes: measurement means which chronologically measures an amount of energy supply for each supply line supplying energy to a plurality of loads as energy consumption of the supply line; consumption information transmission means which transmits consumption information pertaining to the energy consumption measured to a monitoring device which collects information pertaining to the energy consumption measured; report instruction reception means which receives, from the monitoring device, an instruction to transmit a report signal in a case where the energy consumption by the load exceeds preset recommended consumption, the report signal reporting the case; and report signal transmission means which transmits the report signal on the basis of the instruction received, the computer includes: load specifying information storage means which stores each type of the load in association with load specification information including typical energy consumption of the load and a typical usage time slot of the load; and recommended consumption information storage means which stores recommended consumption information pertaining to recommended consumption of energy for the each type of the load, and the method performs: a process of receiving the consumption information from the measurement instrument; a process of referring to the load specifying information storage means and specifying a type of the load used on the basis of the consumption information; a process of referring to the recommended consumption information storage means and determining whether or not the energy consumption by the load specified falls within a range of the recommended consumption pertaining to the recommended consumption information; and a process of transmitting the instruction to transmit the report signal to the measurement instrument when it is determined as a result of the determination process that the energy consumption pertaining to the consumption information exceeds the range of the recommended consumption pertaining to the recommended consumption information.

Furthermore, a computer program which allows a computer to function as a monitoring device monitoring energy consumption according to another aspect of the present invention, wherein the computer is configured to be able to communicate with a measurement instrument via a network, the measurement instrument including: measurement means which chronologically measures an amount of energy supply for each supply line supplying energy to a plurality of loads as the energy consumption of the supply line; consumption information transmission means which transmits consumption information pertaining to the energy consumption measured to a monitoring device which collects information pertaining to the energy consumption measured; report instruction reception means which receives, from the monitoring device, an instruction to transmit a report signal in a case where the energy consumption by the load exceeds preset recommended consumption, the report signal reporting the case; and report signal transmission means which transmits the report signal on the basis of the instruction received, and the computer including: load specifying information storage means which stores each type of the load in association with load specification information including typical energy consumption of the load and a typical usage time slot of the load; and recommended consumption information storage means which stores recommended consumption information pertaining to recommended consumption of energy for the each type of the load, and the computer program causes the computer to perform: a process of receiving the consumption information from the measurement instrument; a process of referring to the load specifying information storage means and specifying a type of the load used on the basis of the consumption information; a process of referring to the recommended consumption information storage means and determining whether or not the energy consumption by the load specified falls within a range of the recommended consumption pertaining to the recommended consumption information; and a process of transmitting the instruction to transmit the report signal to the measurement instrument when it is determined as a result of the determination process that the energy consumption pertaining to the consumption information exceeds the range of the recommended consumption pertaining to the recommended consumption information.

Advantageous Effects of Invention

The present invention can keep track of the energy consumption of each load without installing a dedicated device in each load. Moreover, the present invention provides advertisement information regarding a recommended load on the basis of the energy consumption, thereby being useful for promoting energy saving or the like.

BRIEF DESCRIPTION OF DRAWINGS

FIG. 4 is a table illustrating an example of data stored in a load specifying information storage unit in the present embodiment.

FIG. 5 is a table illustrating an example of data stored in a corresponding information storage unit in the present embodiment.

FIG. 6 is a table illustrating an example of data stored in a consumption information storage unit in the present embodiment.

FIG. 10 is a sequence diagram illustrating a flow of a series of processes performed by the energy consumption monitoring system according to the present embodiment.

DESCRIPTION OF EMBODIMENTS

Now, an energy consumption monitoring system according to an embodiment of the present invention will be described with reference to the drawings. While the present embodiment is an example where electrical power is provided as a form of energy consumed, another form of energy such as a gas or water or a resource can be applied likewise.

Figure 1:
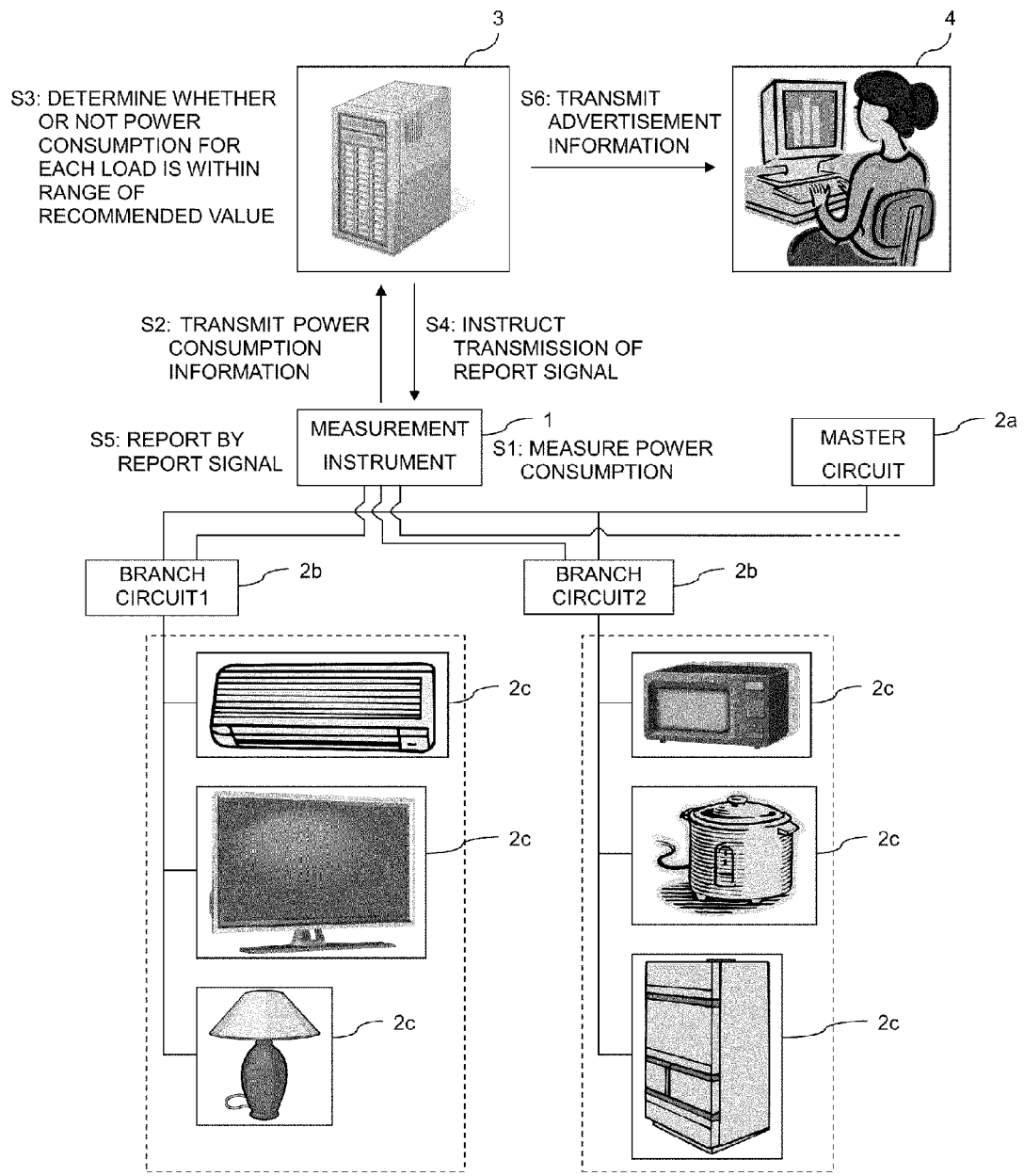
FIG. 1 is a schematic view illustrating an overview of an energy consumption monitoring system according to an embodiment of the present invention.

An overview of the energy consumption monitoring system according to the present embodiment will be described first with reference to FIG. 1.

A measurement instrument 1 which monitors power consumption is installed in a residence of a customer who receives service provided by the energy consumption monitoring system according to the present embodiment.

Electrical power supplied from outside into the residence of the customer passes through a master circuit 2a to be distributed to a branch circuit 2b by a panel board and supplied to a load 2c.

The electrical power supplied to each branch circuit 2b is measured by the measurement instrument 1 as power consumption of each load 2c (S1).

Information pertaining to the power consumption measured by the measurement instrument 1 (hereinafter referred to as "power consumption information") is transmitted to a monitoring device 3 via a network such as the Internet (S2).

Upon identifying how much electrical power is consumed by each load 2c on the basis of the power consumption information, the monitoring device 3 determines for each load 2c whether or not the consumption falls within the range of a preset recommended value (S3). Here, the recommended value is the power consumption determined to be preferable or suitable from a standpoint of energy saving or the like and can be set as appropriate.

Consequently, the result of the determination is transmitted from the monitoring device 3 to the measurement instrument 1 when the power consumption of a certain load 2c does not fall within the range of the recommended value (S4).

In response, the measurement instrument 1 transmits a report signal provided in advance and reports the result of the determination to the customer (S5).

The monitoring device 3 further transmits advertisement information of a recommended load 2c to a customer terminal 4 when the power consumption of the certain load 2c does not fall within the recommended value (S6).

Figure 2:
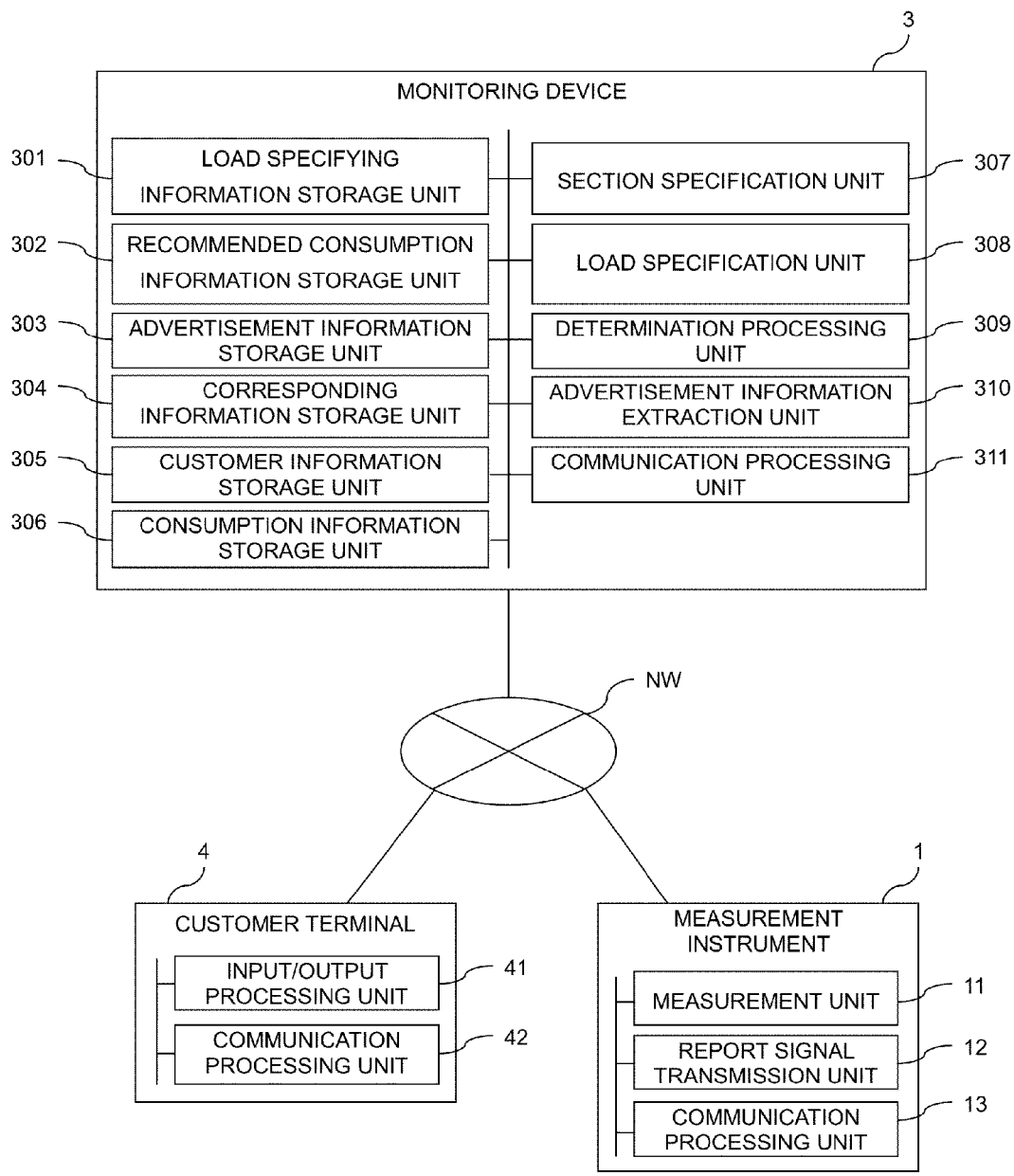
FIG. 2 is a functional block diagram illustrating a configuration of the energy consumption monitoring system according to the present embodiment.

A function of each device configuring the energy consumption monitoring system according to the present embodiment will now be described in detail with reference to FIG. 2.

The energy consumption monitoring system according to the present embodiment is configured such that the measurement instrument 1 which measures the power consumption of the load 2c, the customer terminal 4 used by the customer who uses the load 2c and receives the service provided by the energy consumption monitoring system according to the present embodiment, and the monitoring device 3 which collects the power consumption information from the measurement instrument 1 can communicate one another via a network NW such as the Internet.

The measurement instrument 1 is a device including a plurality of input terminals, each of which is connected to each branch circuit 2b, thereby measuring electrical power supplied to each branch circuit 2b as the power consumption of each load 2c.

The measurement instrument 1 includes each functional block including a measurement unit 11, a report signal transmission unit 12, and a communication processing unit 13 formed of a CPU (Central Processing Unit), a computer program executed by the CPU, a RAM (Random Access Memory) in which predetermined data is stored and the like.

The measurement unit 11 is a processing unit which measures the electrical power supplied to each branch circuit 2b as the power consumption of each load 2c and includes an output part, a conversion part, and a calculation part.

The output part outputs a detection voltage corresponding to the voltage in a service wire which draws in electricity as well as a detection current corresponding to the current flowing through the service wire. The conversion part generates a pulse signal proportional to electrical power and transmits the pulse signal to the calculation part. The calculation part counts the pulse signal and calculates a value indicating the electrical power used.

Figure 3:
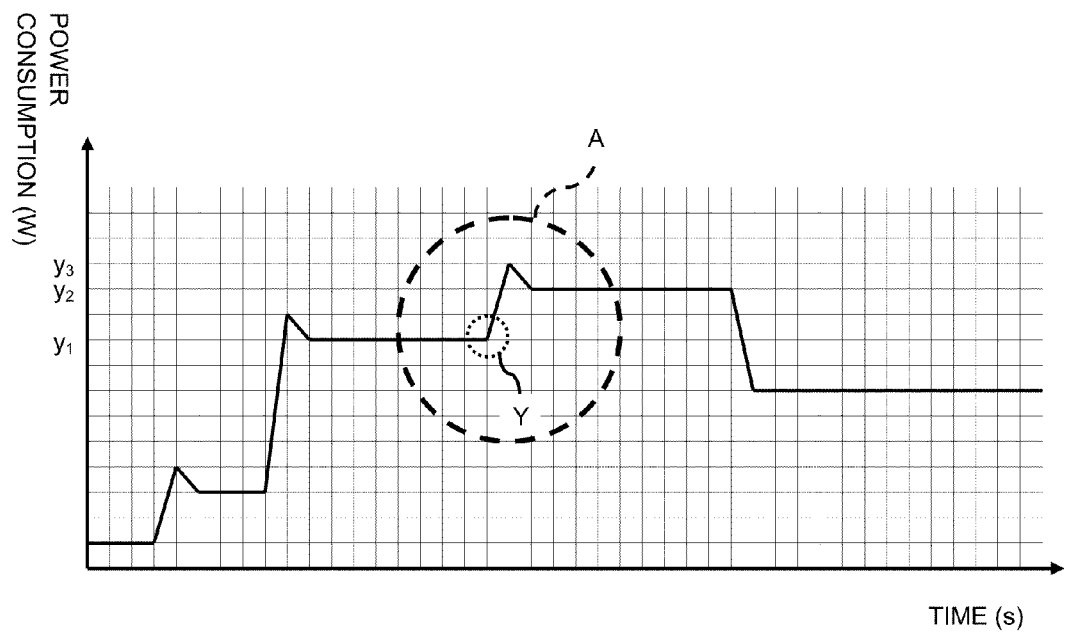
FIG. 3 is a diagram illustrating an example of a graphical representation of data on power consumption measured by a measurement instrument in the present embodiment.

Here, the power consumption is measured in time series for each branch circuit 2b as illustrated in FIG. 3 so that one can figure out how much electrical power is consumed by which branch circuit 2b at what time.

The report signal transmission unit 12 transmits the report signal in response to an instruction from the monitoring device 3 when the power consumption of the load 2c does not fall within the range of the recommended consumption. The report signal is configured by a lamp which flickers or blinks, for example.

The customer can therefore figure out whether the power consumption of the load 2c he uses falls within what is recommended.

The communication processing unit 13 is a processing unit which performs a transmission/reception process of data to/from the monitoring device 3 via the network NW such as the Internet according to a predetermined protocol, and is implemented by a Web browser or the like.

For example, the communication processing unit transmits to the monitoring device 3 circuit identification information identifying the branch circuit 2b along with the power consumption information generated by the measurement unit 11, or receives from the monitoring device 3 an instruction to transmit the report signal reporting that the power consumption of the load 2c has exceeded the preset recommended consumption when that happens.

The monitoring device 3 is a device which monitors the power consumption in the customer's residence.

The monitoring device 3 includes each functional block including a load specifying information storage unit 301, a recommended consumption information storage unit 302, an advertisement information storage unit 303, a corresponding information storage unit 304, a customer information storage unit 305, a consumption information storage unit 306, a section specification unit 307, a load specification unit 308, a determination processing unit 309, an advertisement information extraction unit 310, and a communication processing unit 311 formed of a CPU (Central Processing Unit), a computer program executed by the CPU, a RAM (Random Access Memory) and a ROM (Read Only Memory) in which the computer program or predetermined data is stored, and an external storage device such as a hard disk drive.

As illustrated in FIG. 4, the load specifying information storage unit 301 stores, for each section identification information identifying a section, a type of the load 2c classified into the section in association with load specification information including typical power consumption of the load 2c and a typical usage time slot of the load 2c.

Here, the section is a piece of information indicating a place where the load 2c is installed and includes a "living room", a "dining room", and a "bathroom", for example.

By associating in advance a certain section with the load 2c which is typically installed in that section, one can narrow down the load 2c which has consumed electrical power when the electrical power has been consumed in the certain section. For example, one can associate in advance the section corresponding to the "living room" with the load 2c such as an "air conditioner" and a "television" so that, when electrical power is used in the "living room", he can narrow down the consumer of the electrical power to the load 2c such as the "air conditioner" or the "television" which is associated with the "living room".

The typical power consumption of the load 2c can be set to a value having a fixed range such as 200 W to 500 W.

Moreover, the typical usage time slot corresponds to a time slot during which the load 2c is typically used. In terms of the air conditioner, for example, the time slot during summer and winter when the air conditioner is typically used can be set to the months of June to September and December to March, respectively.

The recommended consumption information storage unit 302 stores recommended consumption information pertaining to the recommended consumption of electrical power for each type of the load 2c.

Here, the recommended consumption is a power consumption value that is considered to be desirable from a standpoint of energy saving or the like and can be set as appropriate.

The advertisement information storage unit 303 stores advertisement information of the load 2c which operates with the recommended power consumption for each type of the load 2c.

The advertisement information is in the form of electronic data such as a still image or a moving image, but a file format or the like of the data is not particularly limited.

The corresponding information storage unit 304 is a storage unit which stores, for each customer, the branch circuit 2b in association with section identification information identifying the section to which electrical power is supplied through the branch circuit 2b.

As illustrated in FIG. 5, for example, the corresponding information storage unit 304 stores circuit identification information, which identifies the branch circuit 2b in the customer's residence, in association with the section identification information identifying the section, for each customer identification information identifying the customer.

The customer information storage unit 305 is a storage unit which stores information pertaining to the customer who uses the load 2c.

For example, the customer information storage unit 305 stores the customer identification information identifying the customer, a full name or a name of the customer, and contact information such as an address, a phone number, or an e-mail address required to contact the customer.

On the basis of the power consumption information received from the measurement instrument 1 and information pertaining to the type of the load 2c specified by the load specification unit 308, the consumption information storage unit 306 can store information pertaining to the power consumption of each load 2c that is specified.

As illustrated in FIG. 6, for example, the consumption information storage unit 306 can store the customer identification information, load information pertaining to the load 2c specified by the load specification unit 307, and the power consumption of the load 2c all in association with one another.

The section specification unit 307 refers to the corresponding information storage unit 304 and specifies the section identification information stored in association with the circuit identification information received from the measurement instrument 1. As a result, one can figure out which branch circuit 2b supplies electrical power to which section in the customer's residence.

The load specification unit 308 refers to the load specifying information storage unit 301 to specify the type of the load 2c used on the basis of the section identification information specified by the section specification unit 307 and the power consumption information received from the measurement instrument 1.

In this specifying process, the information pertaining to the individual power consumption of the load 2c and the usage time slot thereof is first extracted from the information pertaining to the power consumption measured by the measurement instrument 1.

Referring to an example illustrated in FIG. 3 (illustrated with a part indicated by an enclosing line A in FIG. 3 though another part may be applied likewise), a rising part Y of the power consumption in the temporal transition thereof is extracted as the information pertaining to the power consumption measured by the measurement instrument 1. Then, a variation $(y_2-y_1)$ in the power consumption before and after the rising part is calculated to be regarded as the power consumption of the load 2c. At this time, the power consumption is calculated more accurately by excluding a change $(y_3-y_2)$ caused by the inrush power instantaneously generated at the start-up of the load 2c.

With regards to the usage time slot, the time slot corresponding to the rising part Y is extracted as the usage time slot of the load 2c.

Note that the rising part Y and the change ($y_3-y_2$) caused by the inrush power can be specified from a rate of increase or a rate of decrease of the power consumption before and after the part concerned.

For example, a part where the power consumption increases by a fixed rate or more before and after the part is extracted as the rising part Y. Moreover, when the power consumption decreases by a fixed rate or more immediately after the rising part Y, a part where the power consumption decreases by the fixed rate or more is excluded while being considered that the part is influenced by the inrush power, whereby a numerical value $y_2$ corresponding to a part where the rate of decrease is less than or equal to a fixed rate is treated as the power consumption after the change.

Next, the load 2c corresponding to the section identification information specified by the section specification unit 307, the power consumption calculated, and the usage time slot is specified by referring to the load specifying information storage unit 301.

In the case where the load specifying information storage unit 301 stores the "living room" as the section, "June to September and December to March" as the usage time slot, and "300 W to 800 W" as the power consumption in association with one another for the "air conditioner" (load 2c), for example, one can specify that the electrical power is consumed by the air conditioner upon figuring out from the section identification information and the power consumption information that "500 W" (power consumption) of electrical power is consumed in the "living room" (section) on "August 1st from 10 AM to 11 PM" (usage time slot).

The determination processing unit 309 refers to the recommended consumption information storage unit 302 to determine whether or not the power consumption of the load 2c specified by the load specification unit 308 falls within the range of the recommended consumption.

The advertisement information extraction unit 310 refers to the advertisement information storage unit 303 and extracts the advertisement information stored in association with the type of the load 2c when the determination processing unit 309 has determined as a result of the determination process that the power consumption of the load 2c specified by the load specification unit 308 exceeds the range of the recommended consumption.

The communication processing unit 311 is a processing unit which performs a transmission/reception process of data to/from the measurement instrument 1 and the customer terminal 4 via the network NW such as the Internet according to a predetermined protocol, and is implemented by a Web browser or the like.

The communication processing unit 311 receives the power consumption information from the measurement instrument 1, transmits the report signal to the measurement instrument 1, and transmits the consumption information stored in the consumption information storage unit 306 to the customer terminal 4, for example.

The customer terminal 4 is a terminal used by a customer who uses the load 2c and receives the service provided by the energy consumption monitoring system according to the present embodiment.

The customer terminal 4 can be configured by a so-called personal computer or the like, has a functional block including an input/output processing unit 41 and a communication processing unit 42, and can communicate with the monitoring device 3 via the network NW such as the Internet.

The input/output processing unit 41 is a functional part that inputs/outputs data and is configured by a display which outputs data received from the monitoring device 3 and a mouse and a keyboard by which a customer inputs data.

The communication processing unit 42 is a processing unit which performs a transmission/reception process of data to/from the monitoring device 3 via the network NW such as the Internet according to a predetermined protocol, and is implemented by a Web browser or the like.

The communication processing unit 42 receives the information pertaining to the power consumption of each load 2c from the monitoring device 3, for example.

Figure 7:
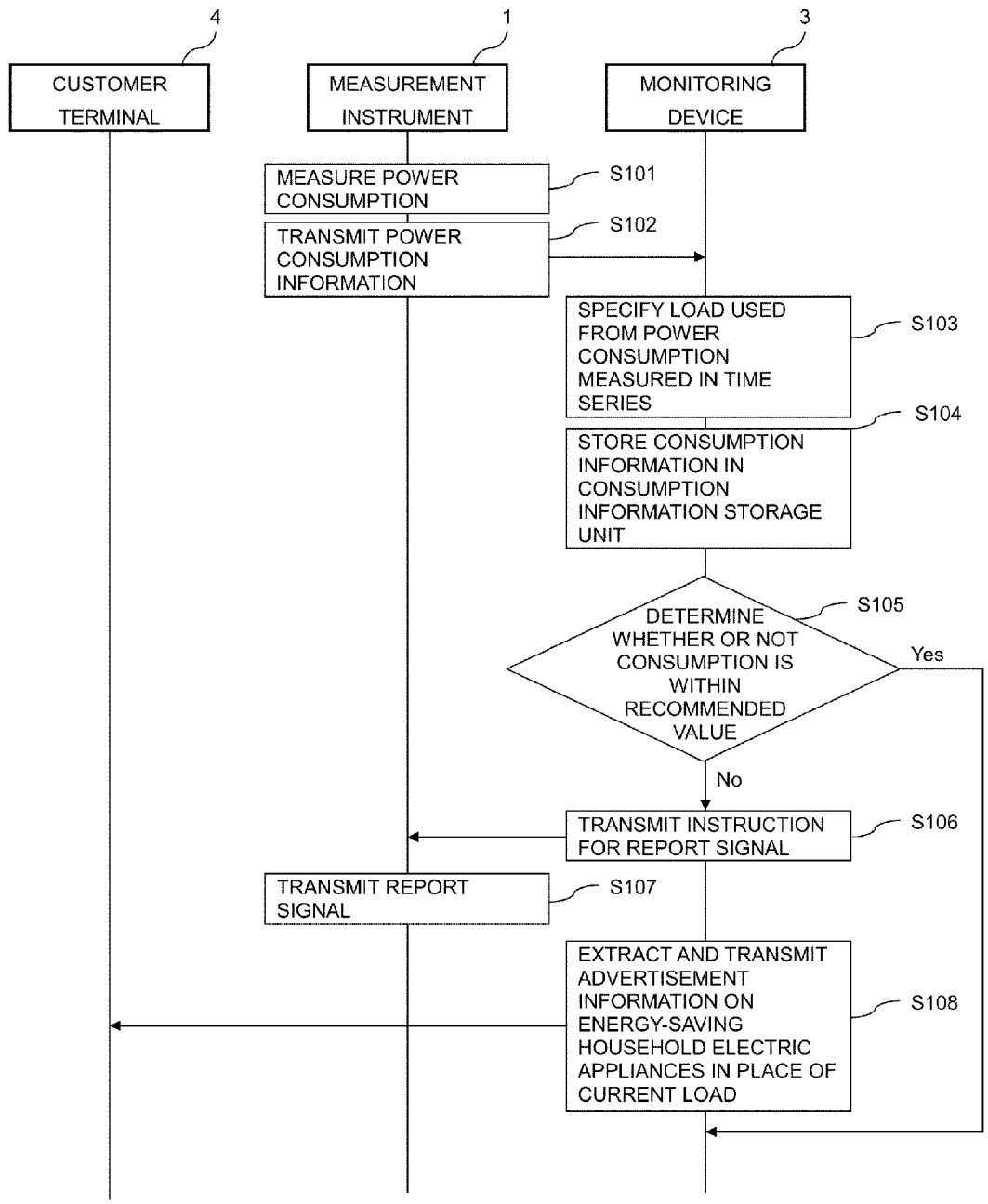
FIG. 7 is a sequence diagram illustrating a flow of a series of processes performed by the energy consumption monitoring system according to the present embodiment.

The flow of a series of processes performed by the energy consumption monitoring system according to the present embodiment will now be described with reference to FIG. 7.

First, the measurement instrument 1 measures the power consumption of each branch circuit 2b by using the measurement unit 11 (S101).

The power consumption measured for each branch circuit 2b is associated with the circuit identification information identifying the branch circuit 2b and transmitted to the monitoring device 3 as the power consumption information (S102). At this time, the customer identification information identifying a customer is transmitted as well.

Note that the power consumption information may be transmitted to the monitoring device 3 at a predetermined timing after accumulating the information for a fixed period of time in the measurement instrument 1, or may be transmitted one by one.

Upon receiving the power consumption information for each branch circuit 2b along with the circuit identification information, the load specification unit 308 of the monitoring device 3 specifies the load 2c being used (S103).

Note that this process of specifying the load 2c by the load specification unit 308 will be described in detail later.

Once the load 2c has been specified, the power consumption of each load 2c is associated with the customer identification information and registered in the consumption information storage unit 306 (S104).

The determination processing unit 309 then refers to the recommended consumption information storage unit 302 and determines whether or not the power consumption of the load 2c falls within the range of the recommended consumption (S105).

When it is determined as a result that the power consumption of the load 2c does not fall within the range of the recommended consumption, command information giving the instruction to transmit the report signal is transmitted to the measurement instrument 1, the report signal reporting the situation to the customer (S106).

On the other hand, the process is completed as is when the power consumption of the load 2c falls within the range of the recommended consumption.

Upon receiving the command information which gives the instruction to transmit the report signal from the monitoring device 3, the measurement instrument 1 transmits the report signal from the report signal transmission unit 12 (S107).

The monitoring device 3 further refers to the advertisement information storage unit 303 by using the advertisement information extraction unit 310, extracts the advertisement information of the load 2c recommended in place of the load 2c, the power consumption of which does not fall within the range of the recommended consumption, and transmits the information to the customer terminal 4 (S108).

As a result, the customer can figure out whether the load 2c he uses operates within the range of the recommended consumption and can obtain information on the substitute load 2c when the power consumption does not fall within the range of the recommended consumption.

Figure 8:
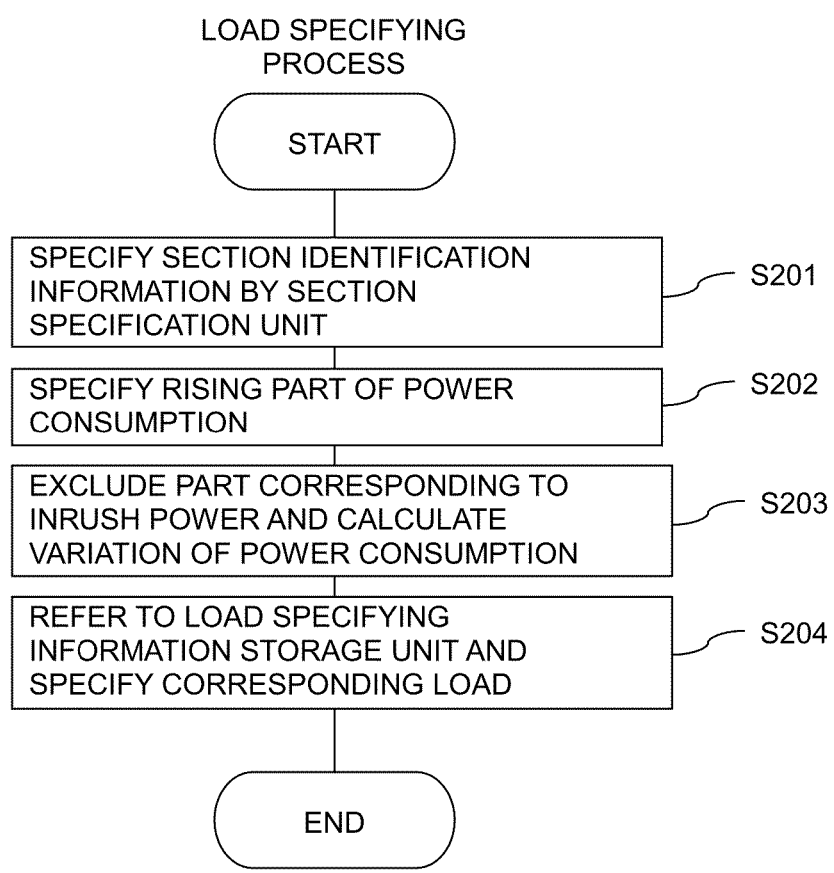
FIG. 8 is a process flow diagram illustrating a flow of a process specifying a load in the energy consumption monitoring system according to the present embodiment.

Next, the process flow of specifying the load 2c by the load specification unit 308 on the basis of the customer identification information, the circuit identification information, and the power consumption information received from the measurement instrument 1 will be described with reference to FIG. 8.

First, the section specification unit 307 refers to the corresponding information storage unit 304 and specifies the section identification information stored in association with the customer identification information and the circuit identification information received from the measurement instrument 1 (S201).

The information pertaining to the power consumption and the usage time slot of the individual load 2c is then extracted from the power consumption information.

Specifically, the rising part where the power consumption increases rapidly at a preset fixed rate that or greater is specified from the temporal transition of the power consumption (S202). The variation of the power consumption before and after the rising part is calculated thereafter to be regarded as the power consumption of the load 2c (S203).

Excluded at this time is the change caused by the inrush power that is generated instantaneously at the start-up of the load 2c. That is, the power consumption regarded as that of the load 2c is obtained by a difference between the power consumption before the rising part and the power consumption after the start-up of the load 2c where the rate of change of the power consumption has settled to the preset fixed rate or lower. As a result, the power consumption of the load 2c can be obtained more accurately by leaving out the temporary power consumption caused by the inrush power.

With regards to the usage time slot, the time corresponding to the rising part is extracted as the usage time slot of the load 2c.

The load specification unit thereafter refers to the load specifying information storage unit 301 and specifies the load 2c corresponding to the section identification information specified, the power consumption calculated, and the usage time slot (S204).

The energy consumption monitoring system according to the present embodiment described above can measure the energy consumption of each load 2c without installing a device in each load 2c.

Note that in the present embodiment described above, the consumption information of each customer stored in the consumption information storage unit 306 may be transmitted to the customer terminal 4 according to a request by the customer.

Figure 9:
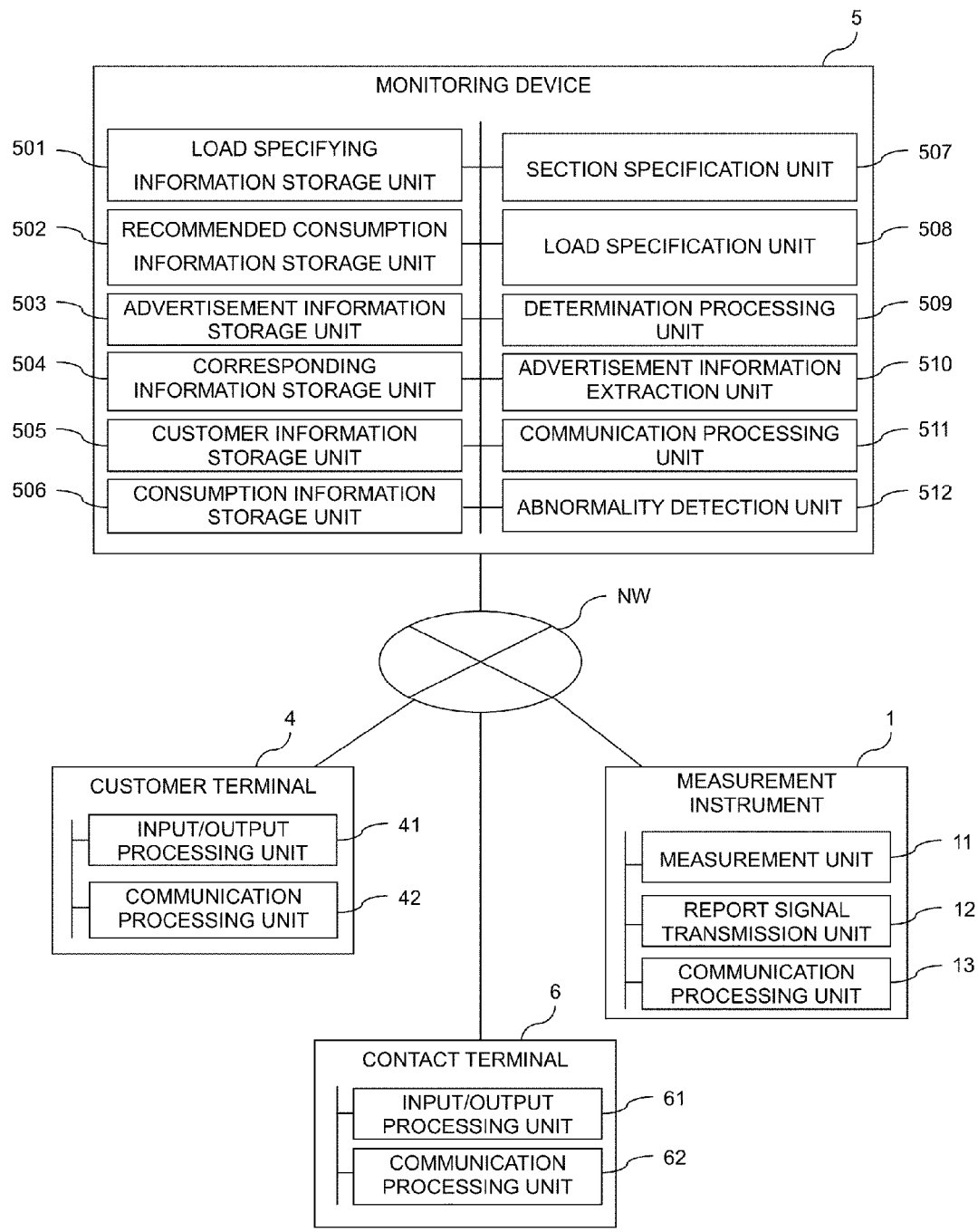
FIG. 9 is a functional block diagram illustrating a configuration of an energy consumption monitoring system according to another embodiment of the present invention.

An energy consumption monitoring system according to another embodiment of the present invention will now be described with reference to FIG. 9.

In addition to the aforementioned process of specifying the power consumption of the load 2c and transmitting the information and the advertisement information to the customer, the energy consumption monitoring system according to the present embodiment detects whether or not there is anything abnormal about the customer and, when it is determined that there is something abnormal, notifies a predetermined contact of the abnormality.

The energy consumption monitoring system according to the present embodiment includes a measurement instrument 1, a customer terminal 4, a monitoring device 5 and a contact terminal 6 which can communicate with one another via a network NW such as the Internet.

Note that the configuration of each of the measurement instrument 1 and the customer terminal 4 is the same as what has been described.

The contact terminal 6 is a terminal used by a contact subject notified of abnormality when it is recognized from power consumption information that there is something abnormal about a customer.

This contact terminal 6 can be configured by what is called a computer, for example, and includes an acquisition processing unit 61 and a communication processing unit 62.

The input/output processing unit 61 is a functional part which inputs/outputs data and is configured by a display which outputs data received from the monitoring device 5, a mouse and a keyboard by which a customer inputs data, and the like.

The communication processing unit 62 is a processing unit which performs a transmission/reception process of data to/from the monitoring device 5 via the network NW such as the Internet according to a predetermined protocol, and is implemented by a Web browser or the like.

The communication processing unit 62 receives alert information regarding abnormality experienced by a customer from the monitoring device 5, for example.

Similar to the monitoring device 3 described above, the monitoring device 5 is a device which monitors power consumption in a customer's residence.

The monitoring device 5 includes each functional block including a load specifying information storage unit 501, a recommended consumption information storage unit 502, an advertisement information storage unit 503, a corresponding information storage unit 504, a customer information storage unit 505, a consumption information storage unit 506, a section specification unit 507, a load specification unit 508, a determination processing unit 509, an advertisement information extraction unit 510, a communication processing unit 511 and an abnormality detection unit 512 formed of a CPU (Central Processing Unit), a computer program executed by the CPU, a RAM (Random Access Memory) or a ROM (Read Only Memory) which stores the computer program or predetermined data, and an external storage device such as a hard disk drive.

Note that the configuration of each of the load specifying information storage unit 501, the recommended consumption information storage unit 502, the advertisement information storage unit 503, the corresponding information storage unit 504, the consumption information storage unit 506, the section specification unit 507, the load specification unit 508, the determination processing unit 509, the advertisement information extraction unit 510, and the communication processing unit 511 is similar to the configuration of each of the load specifying information storage unit 301, the recommended consumption information storage unit 302, the advertisement information storage unit 303, the corresponding information storage unit 304, the consumption information storage unit 306, the section specification unit 307, the load specification unit 308, the determination processing unit 309, the advertisement information extraction unit 310, and the communication processing unit 311 which have been described.

Stored in association with one another in the customer information storage unit 505 are customer identification information identifying a customer, a full name or a name of the customer, contact information such as an address, a phone number, or an e-mail address required to contact the customer as well as information regarding a contact that is contacted about abnormality when there is something abnormal about the customer.

The information pertaining to the contact includes address information or the like such as the e-mail address to which information is transmitted in addition to the full name or the name of the contact.

The abnormality detection unit 512 determines whether or not there is anything abnormal about the customer so that the communication processing unit 511 transmits the notification of abnormality occurring to the contact terminal when the abnormality detection unit has determined the abnormality is occurring.

Here, the process of detecting abnormality is performed by detecting whether or not no power is consumed for a fixed period of time on the basis of the power consumption information received from the measurement instrument 1.

It is determined that there is no abnormality when a change in the power consumption has been recognized during the fixed period of time, regarding that the customer has taken an action based on some life activity. On the other hand, it is determined that there is something abnormal occurring with the customer when no change in the power consumption has been recognized during the fixed period of time, regarding that there is no life activity.

FIG. 10 illustrates a process flow of detecting whether or not there is anything abnormal about the customer in the energy consumption monitoring system according to the present embodiment.

Similar to what has been described, the measurement instrument 1 first measures the power consumption of each branch circuit 2b in the customer's residence (S301) and transmits power consumption information to the monitoring device 5 along with customer identification information and circuit identification information (S302).

Once the monitoring device 5 has received the power consumption information from the measurement instrument 1, the abnormality detection unit 512 determines whether or not there is anything abnormal about the customer on the basis of the power consumption information (S303).

This determination process is performed by detecting whether or not no power is consumed for a fixed period of time. That is, it is determined that there is no abnormality when a change in the power consumption has been recognized during the fixed period of time, regarding that the customer has taken an action based on some life activity. On the other hand, it is determined that there is something abnormal occurring with the customer when no change in the power consumption has been recognized during the fixed period of time, regarding that there is no life activity.

The process is completed as is when no abnormality has been particularly recognized as a result of the process performed in S303.

When abnormality has been recognized, on the other hand, a contact stored in association with the customer, with whom the abnormality has been recognized, is specified by referring to the customer information storage unit 505. Then, the alert information indicating that abnormality is being experienced by the customer is transmitted to the contact terminal 6 of the contact (S304).

According to the aforementioned present embodiment, one can easily figure out a condition of the customer on the basis of the power consumption obtained from the measurement instrument 1 so that a predetermined contact is notified of the condition when some abnormality is possibly occurring, thereby providing one with peace of mind.

Note that the energy consumption monitoring system according to the aforementioned embodiments of the present invention can be operated while being applied to a variety of forms.

For example, the power consumption information may be provided to a customer in an SNS (Social Network Service) or Twitter (Registered Trademark).

REFERENCE SIGNS LIST 1 measurement instrument
11 measurement unit
12 report signal transmission unit
13 communication processing unit
2a master circuit
2b branch circuit
2c load
3 monitoring device
301 load specifying information storage unit
302 recommended consumption information storage unit
303 advertisement information storage unit
304 corresponding information storage unit
305 customer information storage unit
306 consumption information storage unit
307 section specification unit
308 load specification unit
309 determination processing unit
310 advertisement information extraction unit
311 communication processing unit
4 customer terminal
41 input/output processing unit
42 communication processing unit
5 monitoring device
501 load specifying information storage unit
502 recommended consumption information storage unit
503 advertisement information storage unit
504 corresponding information storage unit
505 customer information storage unit
506 consumption information storage unit
507 section specification unit
508 load specification unit
509 determination processing unit
510 advertisement information extraction unit
511 communication processing unit
512 abnormality detection unit
NW network

The invention claimed is:

1. An energy consumption monitoring system which monitors energy consumption by a load, comprising:
a measurement instrument which measures an amount of energy supply for each supply line supplying energy to a plurality of loads as energy consumption of the supply line; and
a monitoring device which collects information pertaining to the energy consumption measured, the measurement instrument and the monitoring device being configured to be able to communicate via a network, wherein
the measurement instrument includes:
measurement means which chronologically measures energy consumption of the each supply line;
first consumption information transmission means which transmits consumption information pertaining to the measured energy consumption to the monitoring device;
report instruction reception means which receives, from the monitoring device, an instruction to transmit a report signal in a case where the energy consumption by the load exceeds preset recommended consumption, the report signal reporting the case; and
report signal transmission means which transmits the report signal on the basis of the instruction received, and
the monitoring device includes:
load specifying information storage means which stores each type of the load in association with load specification information including typical energy consumption of the load and a typical usage time slot of the load;

recommended consumption information storage means which stores recommended consumption information pertaining to recommended consumption of energy for the each type of the load;

consumption information reception means which receives the consumption information from the measurement instrument;

load specification means which refers to the load specifying information storage means and specifies a type of the load used on the basis of the consumption information;

determination processing means which refers to the recommended consumption information storage means and determines whether or not the energy consumption by the load specified falls within a range of the recommended consumption pertaining to the recommended consumption information; and report instruction transmission means which transmits an instruction to transmit the report signal to the measurement instrument when it is determined as a result of the determination process that the energy consumption pertaining to the consumption information exceeds the range of the recommended consumption pertaining to the recommended consumption information.

2. The energy consumption monitoring system according to claim 1, wherein the monitoring device further comprises:

advertisement information storage means which stores advertisement information of a load that operates with the recommended consumption of energy for the each type of the load; and advertisement information extraction means which refers to the advertisement information storage means and extracts advertisement information stored in association with the type of the load specified, when it is determined as a result of the determination process that the energy consumption by the load specified exceeds the range of the recommended consumption.

3. The energy consumption monitoring system according to claim 1, wherein the first consumption information transmission means of the measurement instrument transmits to the monitoring device the consumption information pertaining to the measured energy consumption along with supply line identification information identifying the supply line, the monitoring device further comprises:

corresponding information storage means which stores the supply line identification information in association with section identification information identifying a section in which the load is installed; and section specification means which refers to the corresponding information storage means and specifies the section identification information stored in association with the supply line identification information received from the measurement instrument, the consumption information reception means receives the consumption information along with the supply line identification information from the measurement instrument, the load specifying information storage means stores, for the each section identification information, a type of the load installed in the section pertaining to the section identification information in association with load specification information including typical energy consumption of the load and a typical usage time slot of the load, and the load specification means refers to the load specifying information storage means and specifies the type of the load used on the basis of the section identification information specified and the consumption information.

4. The energy consumption monitoring system according to claim 1, wherein the system is configured to be able to further communicate with a customer terminal used by a customer who uses the load via the network, and the monitoring device further comprises second consumption information transmission means which transmits, to the customer terminal, information pertaining to the energy consumption of the each load specified on the basis of the consumption information received by the consumption information reception means and the information pertaining to the type of the load specified by the load specification means.

5. A method of monitoring energy consumption by a computer which is configured to be able to communicate with a measurement instrument via a network, wherein the measurement instrument includes:

measurement means which chronologically measures an amount of energy supply for each supply line supplying energy to a plurality of loads as energy consumption of the supply line;

consumption information transmission means which transmits consumption information pertaining to the energy consumption measured to a monitoring device which collects information pertaining to the energy consumption measured;

report instruction reception means which receives, from the monitoring device, an instruction to transmit a report signal in a case where the energy consumption by the load exceeds preset recommended consumption, the report signal reporting the case; and report signal transmission means which transmits the report signal on the basis of the instruction received, the computer includes:

load specifying information storage means which stores each type of the load in association with load specification information including typical energy consumption of the load and a typical usage time slot of the load; and recommended consumption information storage means which stores recommended consumption information pertaining to recommended consumption of energy for the each type of the load, and the method performs:

a process of receiving the consumption information from the measurement instrument;

a process of referring to the load specifying information storage means and specifying a type of the load used on the basis of the consumption information;

a process of referring to the recommended consumption information storage means and determining whether or not the energy consumption by the load specified falls within a range of the recommended consumption pertaining to the recommended consumption information; and a process of transmitting the instruction to transmit the report signal to the measurement instrument when it is determined as a result of the determination process that the energy consumption pertaining to the consumption information exceeds the range of the recommended consumption pertaining to the recommended consumption information.

6. A system comprising a computer and a computer program which allows a computer to function as a monitoring device monitoring energy consumption, wherein the computer is configured to be able to communicate with a measurement instrument via a network, the measurement instrument including:

measurement means which chronologically measures an amount of energy supply for each supply line supplying energy to a plurality of loads as the energy consumption of the supply line;

consumption information transmission means which transmits consumption information pertaining to the energy consumption measured to a monitoring device which collects information pertaining to the energy consumption measured;

report instruction reception means which receives, from the monitoring device, an instruction to transmit a report signal in a case where the energy consumption by the load exceeds preset recommended consumption, the report signal reporting the case; and report signal transmission means which transmits the report signal on the basis of the instruction received, and the computer including:

load specifying information storage means which stores each type of the load in association with load specification information including typical energy consumption of the load and a typical usage time slot of the load; and recommended consumption information storage means which stores recommended consumption information pertaining to recommended consumption of energy for the each type of the load, and the computer program causes the computer to perform:

a process of receiving the consumption information from the measurement instrument;

a process of referring to the load specifying information storage means and specifying a type of the load used on the basis of the consumption information;

a process of referring to the recommended consumption information storage means and determining whether or not the energy consumption by the load specified falls within a range of the recommended consumption pertaining to the recommended consumption information; and a process of transmitting the instruction to transmit the report signal to the measurement instrument when it is determined as a result of the determination process that the energy consumption pertaining to the consumption information exceeds the range of the recommended consumption pertaining to the recommended consumption information.

* * * * *